US012581743B2

(12) United States Patent
Yoshikawa et al.

(10) Patent No.: US 12,581,743 B2
(45) Date of Patent: Mar. 17, 2026

(54) ELECTRONIC COMPONENT AND APPARATUS

(71) Applicant: TDK Corporation, Tokyo (JP)

(72) Inventors: Kazuhiro Yoshikawa, Tokyo (JP);
Takeshi Oohashi, Tokyo (JP); Koichi Tsunoda, Tokyo (JP); Mitsuhiro Tomikawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 141 days.

(21) Appl. No.: 18/589,812

(22) Filed: Feb. 28, 2024

(65) Prior Publication Data

US 2024/0203972 A1      Jun. 20, 2024

Related U.S. Application Data

(63) Continuation of application No. PCT/JP2022/024686, filed on Jun. 21, 2022.

(30) Foreign Application Priority Data

Aug. 31, 2021    (JP) ................................. 2021-140987

(51) Int. Cl.
| | |
|---|---|
| *H10D 86/85* | (2025.01) |
| *H01L 21/70* | (2006.01) |
| *H01L 23/00* | (2006.01) |

(52) U.S. Cl.
CPC ........... *H10D 86/85* (2025.01); *H01L 21/702* (2013.01); *H01L 24/05* (2013.01); *H01L 24/03* (2013.01);
(Continued)

(58) Field of Classification Search
CPC .......... H05K 1/18; H01L 21/702; H03H 1/00; H03H 3/00; H03H 7/0115; H03H 7/1725; H03H 7/1766; H03H 7/1775
(Continued)

(56) References Cited

U.S. PATENT DOCUMENTS

| | | | | |
|---|---|---|---|---|
| 6,021,050 A | * | 2/2000 | Ehman .................... | H05K 1/165 |
| | | | | 428/209 |
| 6,091,310 A | * | 7/2000 | Utsumi .................. | H05K 1/165 |
| | | | | 336/200 |

(Continued)

FOREIGN PATENT DOCUMENTS

| | | |
|---|---|---|
| JP | 2003-086690 A | 3/2003 |
| JP | 2010-109269 A | 5/2010 |
| JP | 2019-186337 A | 10/2019 |

OTHER PUBLICATIONS

International Search Report and Written Opinion mailed on Aug. 16, 2022, received for PCT Application PCT/JP2022/024686, filed on Jun. 21, 2022, 09 pages including English Translation.

*Primary Examiner* — Tuan T Dinh
(74) *Attorney, Agent, or Firm* — XSENSUS LLP

(57) ABSTRACT

Disclosed herein is an electronic component that includes: a substrate; a capacitor on the substrate; a first insulating resin layer embedding therein the capacitor; an inductor provided on the first insulating resin layer and connected to the capacitor, the inductor including a conductor pattern; a second insulating resin layer embedding therein the inductor; a third insulating resin layer on the second insulating resin layer; a post conductor having a lower end and an upper end and penetrating the third insulating resin layer such that the lower end of the post conductor is connected to the inductor; and a terminal electrode on the third insulating resin layer and connected to the upper end of the post conductor. In a thickness direction of the substrate, the height of the post conductor is larger than a thickness of a conductor pattern constituting the inductor.

19 Claims, 13 Drawing Sheets

(52) U.S. Cl.
CPC .............. *H01L 2224/03462* (2013.01); *H01L 2224/05012* (2013.01); *H01L 2224/05015* (2013.01); *H01L 2224/05016* (2013.01); *H01L 2224/05582* (2013.01); *H01L 2224/05638* (2013.01); *H01L 2224/05655* (2013.01); *H01L 2924/01014* (2013.01)

(58) Field of Classification Search
USPC ................................ 361/763–766, 784, 803
See application file for complete search history.

(56) References Cited

U.S. PATENT DOCUMENTS

| | | | |
|---|---|---|---|
| 6,262,376 B1 * | 7/2001 | Hurwitz ............ | H01L 23/49822 174/262 |
| 7,199,457 B2 * | 4/2007 | Ogawa ............. | H01L 23/49822 257/532 |
| 7,208,832 B2 * | 4/2007 | Yamagata ............... | H01L 24/82 257/E23.179 |
| 7,859,080 B2 * | 12/2010 | Kuwajima ........... | H03H 7/0115 257/532 |
| 8,853,819 B2 * | 10/2014 | Chen ................. | H01L 23/49827 257/E21.004 |
| 10,014,843 B2 * | 7/2018 | Hurwitz ............... | H03H 7/0138 |
| 2010/0295151 A1 | 11/2010 | Kurokawa | |
| 2019/0313528 A1 | 10/2019 | Kuwajima et al. | |
| 2021/0098328 A1 * | 4/2021 | Chu ...................... | H01L 23/585 |

* cited by examiner

ELECTRONIC COMPONENT AND APPARATUS

CROSS-REFERENCE TO RELATED APPLICATIONS

This application is a Continuation of International Application No. PCT/JP2022/024686, filed on Jun. 21, 2022, which claims the benefit of Japanese Patent Application No. 2021-140987, filed on Aug. 31, 2021, the entire disclosure of each is incorporated by reference herein.

BACKGROUND OF THE ART

Field of the Art

The present disclosure relates to an electronic component and, more particularly, to an LC composite electronic component including inductor and capacitor elements.

Description of Related Art

JP 2019-186337A discloses an LC composite electronic component having a structure in which inductor and capacitor elements are stacked on a substrate. In electronic components of such a type, a conductor layer positioned in the uppermost layer is used as a terminal electrode.

The LC composite electronic component described in JP 2019-186337A is mounted up-side down on a circuit board such that the substrate is positioned on the upper side. Thus, in some layouts of a conductor pattern on the circuit board, the conductor pattern on the circuit board and the inductor elements disposed in the LC composite electronic component may be positioned close to each other, resulting in degradation in Q value.

SUMMARY

One of the objectives of the present disclosure is to provide an LC composite electronic component including an inductor element having an appropriate Q value even when mounted on the circuit board.

An LC composite electronic component according to some embodiments of the present disclosure includes: a substrate; a capacitor element or capacitor provided on the substrate; a first insulating resin layer embedding therein the capacitor element; an inductor element or inductor provided on the first insulating resin layer and connected to the capacitor element; a second insulating resin layer embedding therein the inductor element; a third insulating resin layer provided on the second insulating resin layer; a post conductor having a lower end and an upper end and penetrating the third insulating resin layer such that the lower end of the post conductor is connected to the inductor element; and a terminal electrode provided on the third insulating resin layer and connected to the upper end of the post conductor. The height of the post conductor is larger than the thickness of a conductor pattern constituting the inductor element.

BRIEF DESCRIPTION OF THE DRAWINGS

The above features and advantages of the present disclosure will be more apparent from the following description of certain embodiments taken in conjunction with the accompanying drawings, in which.

DETAILED DESCRIPTION OF THE EMBODIMENTS

Some embodiments of the present disclosure will be explained below in detail with reference to the accompanying drawings.

Figure 1:
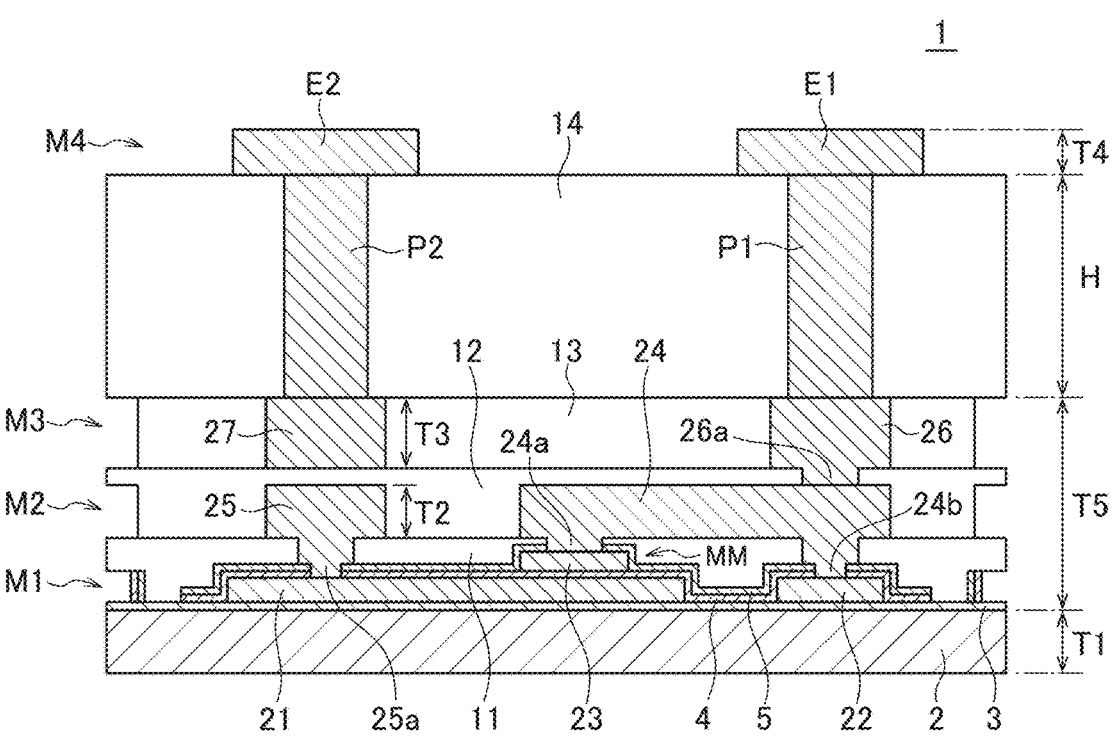
FIG. 1 is a schematic cross-sectional view for explaining the structure of an LC composite electronic component 1 according to a first embodiment of the present disclosure.

FIG. 1 is a schematic cross-sectional view for explaining the structure of an LC composite electronic component 1 according to a first embodiment of the present disclosure.

As illustrated in FIG. 1, the LC composite electronic component 1 according to the present embodiment includes a substrate 2, conductor layers M1 to M4, and insulating resin layers 11 to 14. The conductor layers M1 to M4 and insulating resin layers 11 to 14 are alternately stacked on the upper surface of the substrate 2. The material of the substrate 2 may be any material so long as it is chemically and thermally stable, generates less stress, and can maintain surface smoothness, and examples thereof include, but not particularly limited thereto, silicon single crystal, alumina, sapphire, aluminum nitride, MgO single crystal, SrTiO$_3$ single crystal, surface-oxidized silicon, glass, quartz, ferrite, and a wiring board. The surface of the substrate 2 is covered with a planarizing layer 3. The planarizing layer 3 may be made of, e.g., alumina or silicon oxide.

The conductor layer M1 is a layer positioned in the lowermost layer and includes conductor patterns 21 and 22. The conductor pattern 21 constitutes a lower electrode of a capacitor element, and the upper and side surfaces thereof are covered with a dielectric film (capacitive insulating film) 4. The dielectric film 4 is removed at the outer peripheral portion of the LC composite electronic component 1, thereby achieving stress relaxation.

A conductor pattern 23 is formed on the upper surface of the conductor pattern 21 through the dielectric film 4. The conductor pattern 23 belongs to a conductor layer MM positioned between the conductor layers M1 and M2 and constitutes an upper electrode of the capacitor element. As a result, a capacitor element is formed with the conductor patterns 21 and 23 as the lower and upper electrodes, respectively. The conductor layers M1 and MM are covered with the insulating resin layer 11 through a passivation film 5. In the present embodiment, both the dielectric film 4 and passivation film 5 are made of an inorganic insulating material. The inorganic insulating material constituting the dielectric film 4 and the inorganic insulating material constituting the passivation film 5 may be the same or different. The passivation film 5 is removed at the outer peripheral portion of the LC composite electronic component 1, thereby achieving stress relaxation.

The conductor layer M2 is the second conductor layer formed on the surface of the insulating resin layer 11 and includes conductor patterns 24 and 25. The conductor pattern 24 is connected to the conductor patterns 23 and 22 through respective via conductors 24a and 24b. The conductor pattern 25 is connected to the conductor pattern 21 through a via conductor 25a. The conductor layer M2 is covered with the insulating resin layer 12.

The conductor layer M3 is the third conductor layer formed on the surface of the insulating resin layer 12 and includes conductor patterns 26 and 27. The conductor pattern 26 is connected to the conductor pattern 24 through a via conductor 26a. The conductor layer M3 is embedded in the insulating resin layer 13 and covered with the insulating resin layer 14.

The conductor layer M4 is the fourth conductor layer formed on the surface of the insulating resin layer 14 and includes terminal electrodes E1 and E2. The terminal electrodes E1 and E2 are connected respectively to the conductor patterns 26 and 27 through respective post conductors P1 and P2 penetrating the insulating resin layer 14. The conductor patterns 22 and 24 to 27 each serve as a part of a coil pattern, for example, whereby capacitor and inductor elements are integrated on the substrate 2.

As illustrated in FIG. 1, as compared with typical LC composite electronic components, the LC composite electronic component 1 according to the present embodiment is designed such that the post conductors P1 and P2 are significantly large in height and that the substrate 2 is small in thickness so as not to increase the entire thickness. For example, assuming that the thickness of the substrate 2 is T1, the thickness of the conductor layer M2 is T2, the thickness of the conductor layer M3 is T3, the height (=thickness of the insulating resin layer 14) of the post conductors P1 and P2 is H, and the thickness of the terminal electrodes E1 and E2 is T4, H>T1, H>T2, H>T3, and H>T4 are satisfied. That is, the height H of the post conductors P1 and P2 is larger than the thickness T1 of the substrate 2, larger than the thicknesses T2 and T3 of the conductor patterns 24 to 27 constituting the inductor element, and larger than the thickness T4 of the terminal electrodes E1 and E2. However, when the thickness T1 of the substrate 2 is excessively small, the entire mechanical strength becomes insufficient, so that the thickness T1 of the substrate 2 is preferably set in a range in which sufficient mechanical strength is obtained in the entire structure of the component. Further, as the thicknesses T2 and T3 of the conductor patterns 24 to 27 are reduced, the Q value of the inductor element degrades, so that it is preferable to increase the height H of the post conductor P1 and P2 rather than reducing the thicknesses T2 and T3 of the conductor patterns 24 to 27. The height H of the post conductors P1 and P2 is preferably smaller than the thickness of a functional layer in which the capacitor and inductor elements are formed, i.e., the thickness T5 from the surface of the substrate 2 to the conductor layer M3 as the uppermost one of the layers constituting the inductor element.

For example, the thicknesses T1, T2, T3, T4, and T5 and the height H can be set to 47 μm, 20 μm, 35 μm, 20 μm, 73 μm, and 60 μm, respectively.

Figure 2:
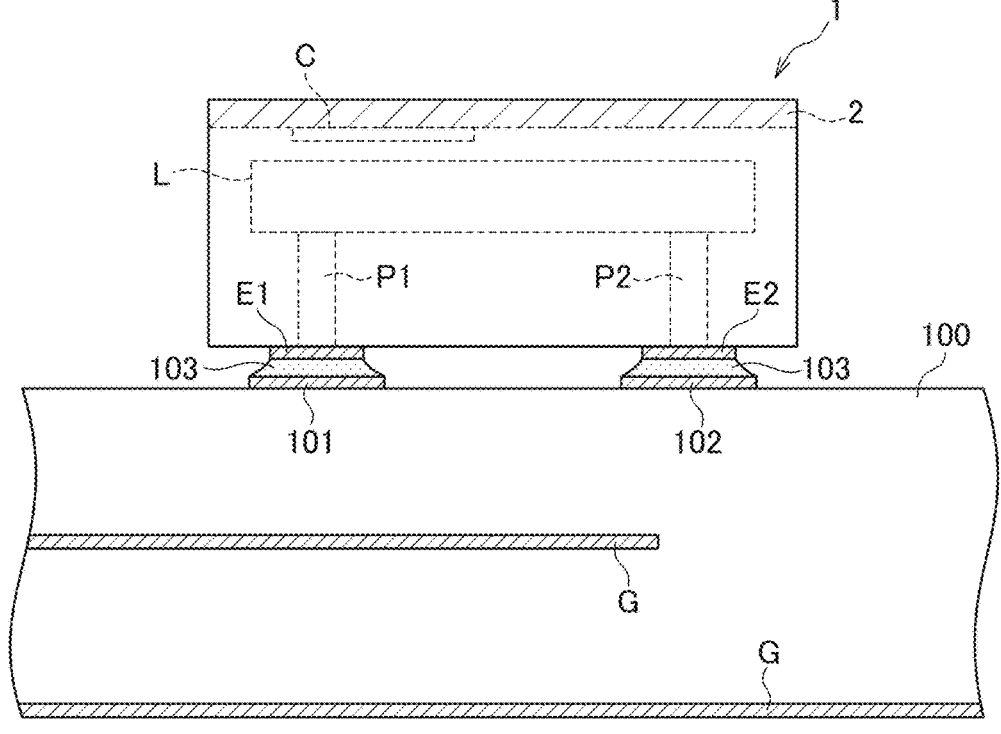
FIG. 2 is a schematic side view illustrating a state where the LC composite electronic component 1 is mounted on a circuit board 100.

FIG. 2 is a schematic side view illustrating a state where the LC composite electronic component 1 according to the present embodiment is mounted on a circuit board 100.

As illustrated in FIG. 2, the LC composite electronic component 1 according to the present embodiment is mounted upside-down on the circuit board 100 such that the substrate 2 is positioned on the upper side. Land patterns 101 and 102 are formed on the surface of the circuit board 100 and connected respectively to the terminal electrodes E1 and E2 through a solder 103. A large-area ground pattern G is also formed inside or on the back surface of the circuit board 100.

When the LC composite electronic component 1 according to the present embodiment is mounted on the thus structured circuit board 100, the Q value of an inductor element L incorporated in the LC composite electronic component 1 may degrade due to the presence of the ground pattern G. However, in the LC composite electronic component 1 according to the present embodiment, the thickness T1 of the substrate 2 is reduced, while the height H of the post conductors P1 and P2 is increased, resulting in an increase in the distance between the inductor element L and the ground pattern G. This suppresses degradation in the Q value of the inductor element L due to the presence of the ground pattern G. In addition, an increase in the vertical size of the post conductors P1 and P2 relaxes stress which is applied to a capacitor element C from the terminal electrode (E1, E2) side, making cracks or the like unlikely to occur in the capacitor element C.

Figure 3:
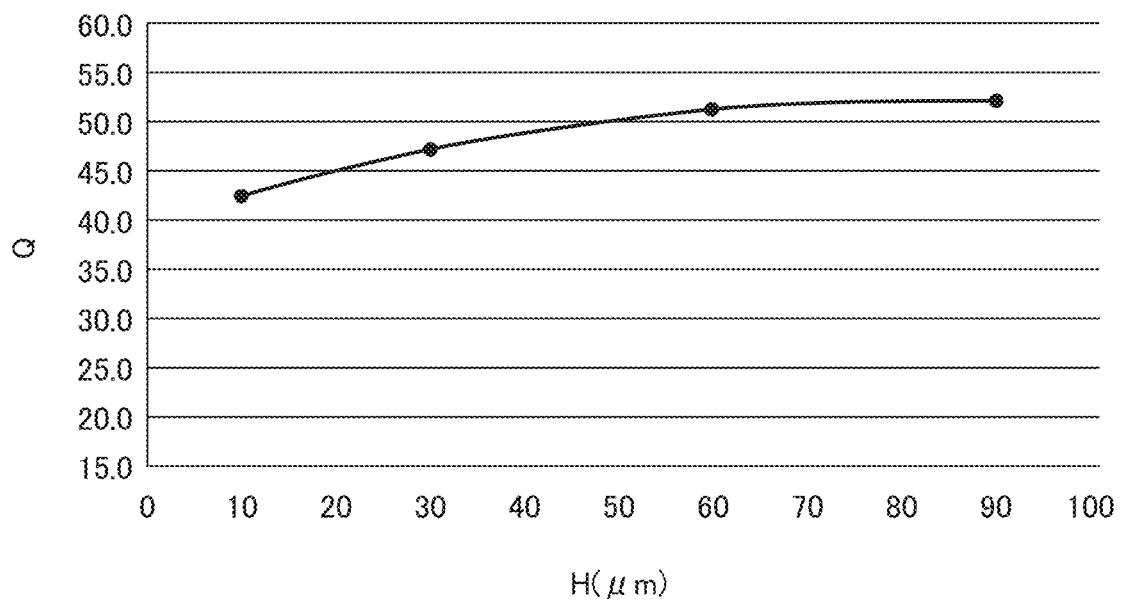
FIG. 3 is a graph illustrating the relation between the height H of the post conductors P1, P2 and the Q value in a state where the LC composite electronic component 1 is mounted on the circuit board 100.

FIG. 3 is a graph illustrating the relation between the height H of the post conductors P1, P2 and the Q value in a state where the LC composite electronic component 1 is mounted on the circuit board 100. In this graph, the values of the T1 to T5 are set to the above-described values.

As illustrated in FIG. 3, the Q value of the inductor element L tends to increase as the height H of the post conductors P1 and P2 increases. However, the increase in the Q value according to the increase in the height H of the post conductors P1 and P2 becomes gentle in the vicinity of H=60 μm and is substantially saturated in the vicinity of H=90 μm. Considering this, the height H of the post conductors P1 and P2 is set to three times or less the thickness T3 of the conductor patterns 26 and 27 constituting the inductor element.

As described above, the LC composite electronic component 1 according to the present embodiment has the post conductors P1 and P2 whose lower ends are connected to the inductor element L and upper ends are connected respectively to the terminal electrodes E1 and E2, and the height H of the post conductors P1 and P2 is sufficiently large. Thus, it is possible to suppress degradation in the Q value in a state where the LC composite electronic component 1 is mounted on the circuit board 100.

Figure 4:
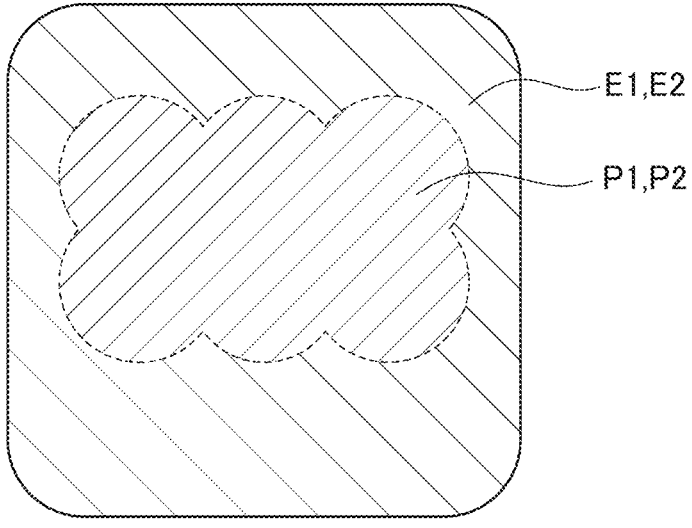
FIG. 4 is a schematic plan view for explaining a planar shape of the post conductors P1 and P2 according to a first modification.
Figure 5:
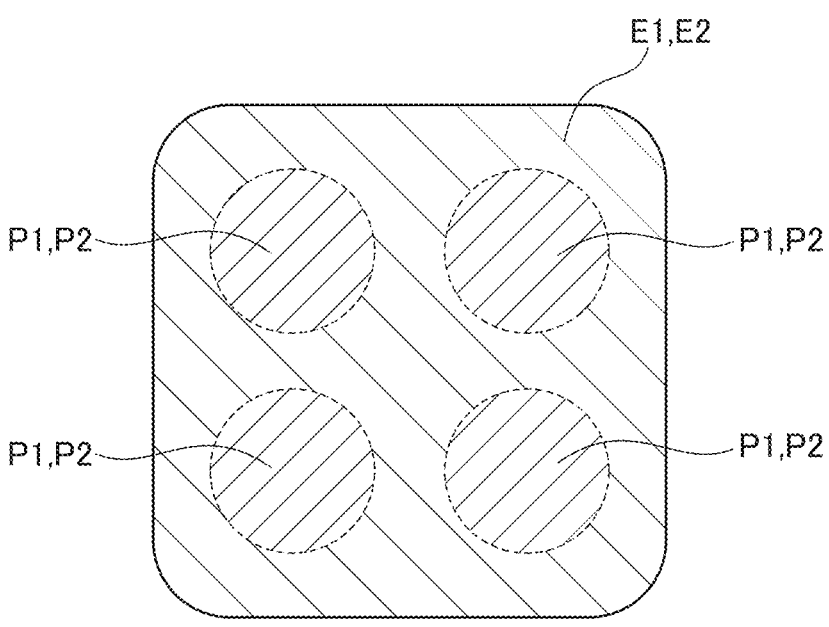
FIG. 5 is a schematic plan view for explaining a planar shape of the post conductors P1 and P2 according to a second modification.

The planar shape of the post conductors P1 and P2 is not particularly limited and may be a circular or rectangular shape. Further, as in a first modification illustrated in FIG. 4, a configuration may be possible in which the post conductors P1 and P2 are each embedded in a plurality of integrated circular openings. For example, when the planar size of the terminal electrodes E1 and E2 is 150 μm×150 μm, the post conductors P1 and P2 may each be embedded in a plurality of overlapping and integrated circular openings each having a diameter of 50 μm. The plurality of circular openings may be formed independently of one another as in a second modification illustrated in FIG. 5. In either case, the planar size of the post conductors P1 and P2 is preferably 40% or more of the planar size of the terminal electrodes E1 and E2. This enhances adhesion between the post conductors P1, P2 and terminal electrodes E1, E2.

Figure 6:
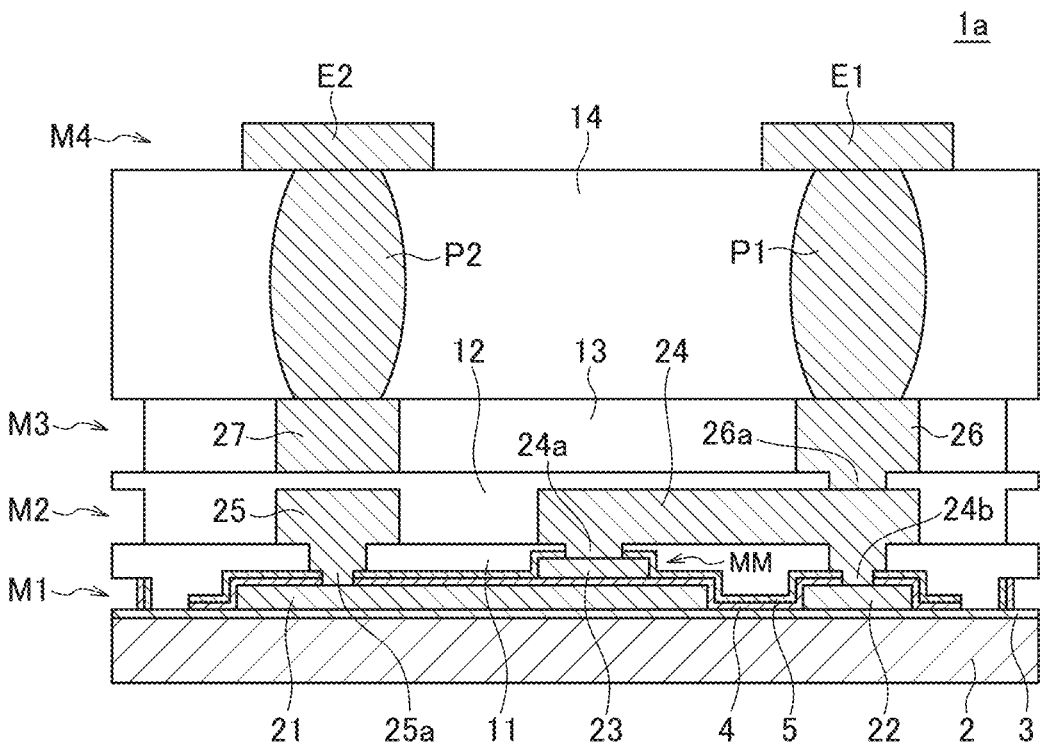
FIG. 6 is a schematic cross-sectional view for explaining a structure of an LC composite electronic component 1a according to a third modification.
Figure 7:
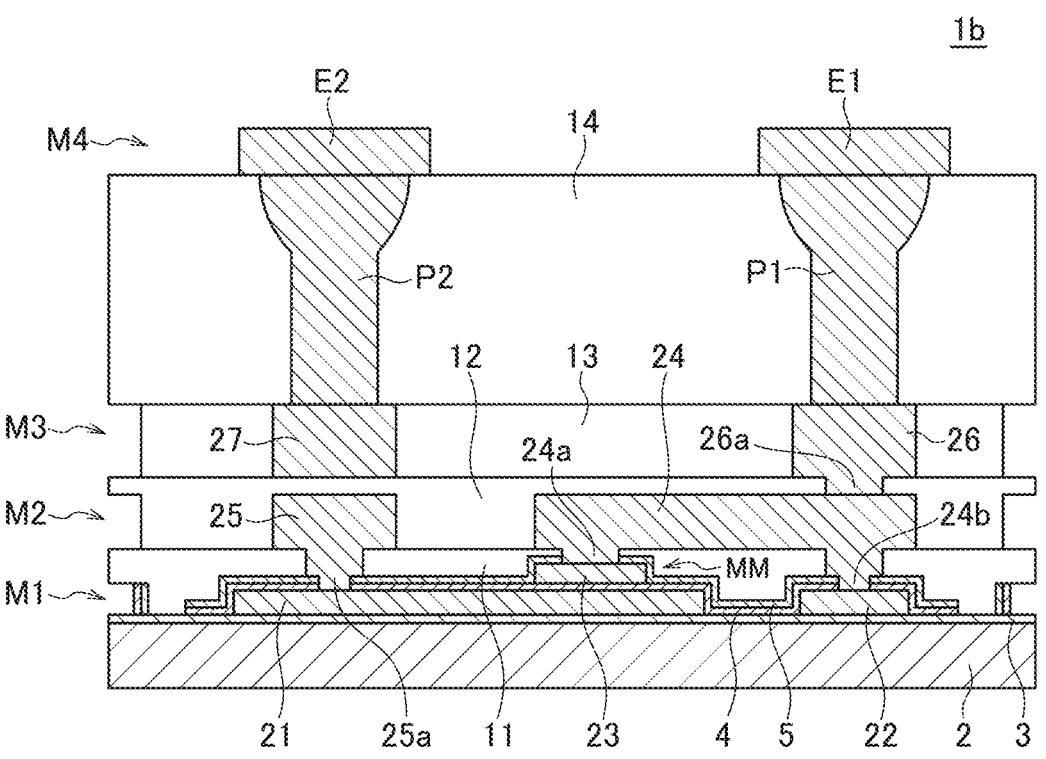
FIG. 7 is a schematic cross-sectional view for explaining a structure of an LC composite electronic component 1b according to a third modification.

The sectional shape of the post conductors P1 and P2 is also not particularly limited. For example, as in an LC composite electronic component 1*a* according to a third modification illustrated in FIG. 6, the post conductors P1 and P2 may each have such a sectional shape that the diameter thereof becomes maximum at its substantially center position in the height direction and decreases toward its both ends in the height direction. This can prevent coming-off of the post conductors P1 and P2. Alternatively, as in an LC composite electronic component 1*b* according to a fourth modification illustrated in FIG. 7, the post conductors P1 and P2 may each have such a sectional shape that the diameter thereof increases at its upper end portion in the height direction. This can increase the contact area between the post conductors P1, P2 and the terminal electrodes E1, E2 without increasing the diameter of the post conductors P1 and P2 at its lower end.

The following describes a manufacturing method for the LC composite electronic component 1 according to the present embodiment.

FIGS. 8 to 31 are process views for explaining the manufacturing method for the LC composite electronic component 1 according to the present embodiment. Although a large number of the LC composite electronic components 1 are obtained from an aggregate substrate in the manufacturing process of the LC composite electronic component 1, the following description will focus on the manufacturing process of a single LC composite electrode component.

Figure 8:
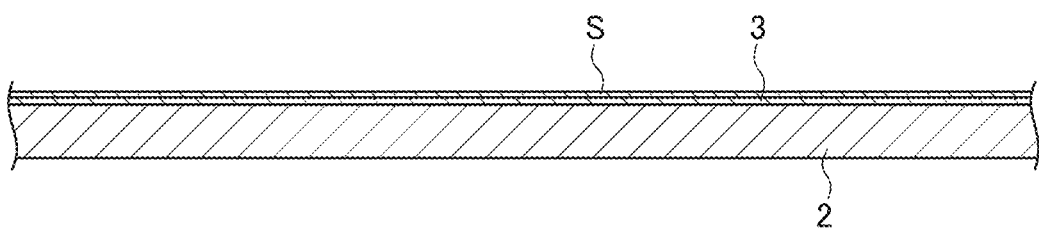
FIGS. 8 to 31 are process views for explaining the manufacturing method for the LC composite electronic component 1.
Figure 9:
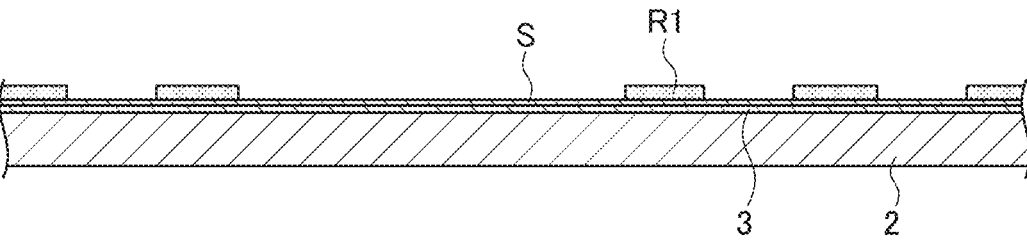
Figure 10:
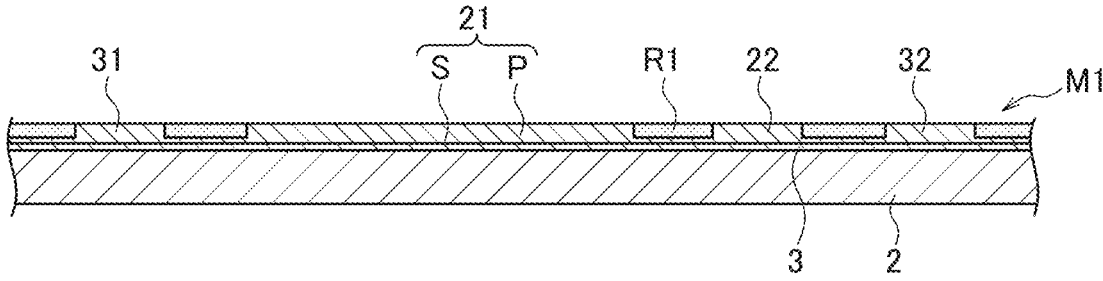
Figure 11:
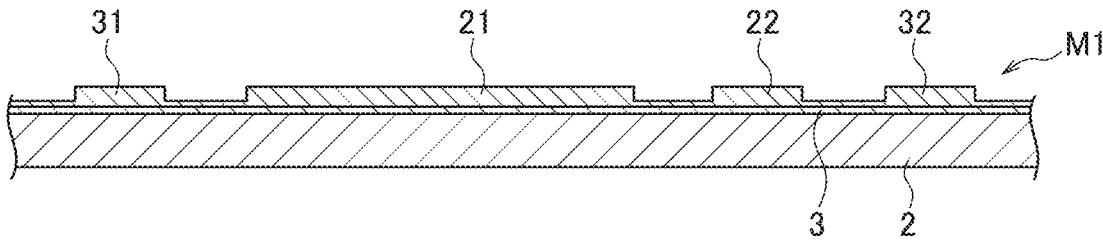
Figure 12:
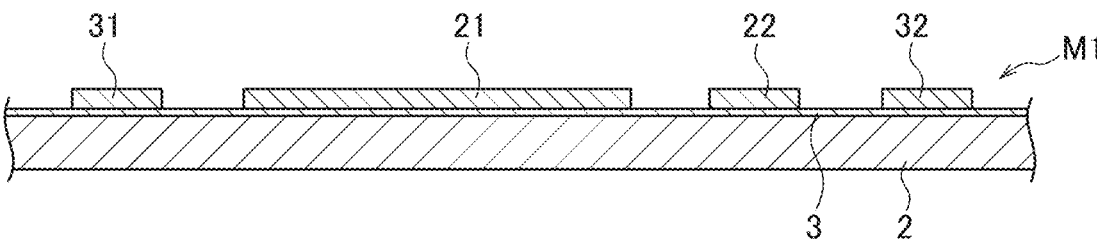

As illustrated in FIG. 8, a planarizing layer 3 is formed by sputtering or the like on the substrate (aggregate substrate) 2, and the surface thereof is subjected to grinding or mirror finishing such as CMP for planarization. Thereafter, a seed layer S is formed by sputtering, electroless plating, or the like on the surface of the planarizing layer 3. Subsequently, as illustrated in FIG. 9, a resist layer R1 is spin-coated on the seed layer S and then patterned so as to expose a part of the seed layer S on which the conductor layer M1 is to be formed. In this state, electrolyte plating is performed using the seed layer S as a feed to form a plating layer P on the seed layer S as illustrated in FIG. 10. A laminated body of the seed layer S and plating layer P constitute the conductor layer M1. In the cross section illustrated in FIG. 10, the conductor layer M1 includes the conductor patterns 21, 22 and sacrificial patterns 31, 32. Then, after removal of the resist layer R1 as illustrated in FIG. 11, the exposed seed layer S is removed as illustrated in FIG. 12, whereby the conductor layer M1 is completed. The removal of the seed layer S can be carried out by etching or ion milling.

Figure 13:
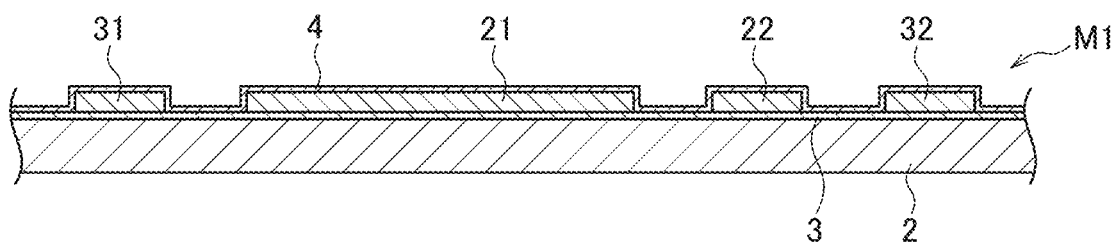

Then, as illustrated in FIG. 13, the dielectric film 4 is formed on the entire surface (including the upper and side surfaces) of the conductor layer M1. The dielectric film 4 may be formed using, for example, an inorganic insulating material including a paraelectric material or a ferroelectric material such as silicon nitride (SiNx) or silicon oxide (SiOx). The dielectric film 4 can be formed by sputtering, plasma CVD, MOCVD, sol-gel, electron beam vapor deposition, or the like.

Figure 14:
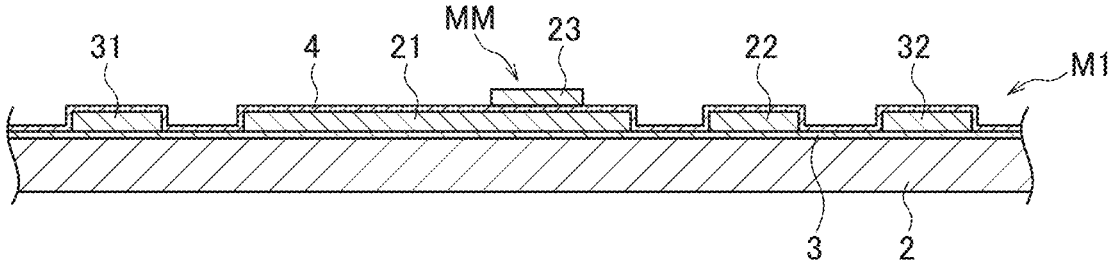
Figure 15:
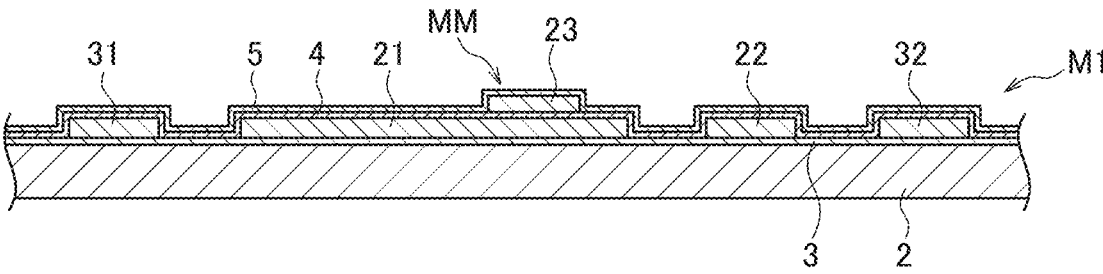

Then, as illustrated in FIG. 14, the same formation method as that for the conductor layer M1 is used to form the conductor pattern 23 on the upper surfaces of the conductor pattern 21 through the dielectric film 4. The conductor pattern 23 is also formed of a laminated body of the seed layer S and plating layer P. This completes the conductor layer MM to thereby form a capacitor having the conductor pattern 21 as the lower electrode and the conductor pattern 23 as the upper electrode. Then, as illustrated in FIG. 15, the passivation film 5 is formed on the entire surface (including the upper and side surfaces) of the conductor layers M1 and MM. The passivation film 5 may be formed using the same material as that of the dielectric film 4.

Figure 16:
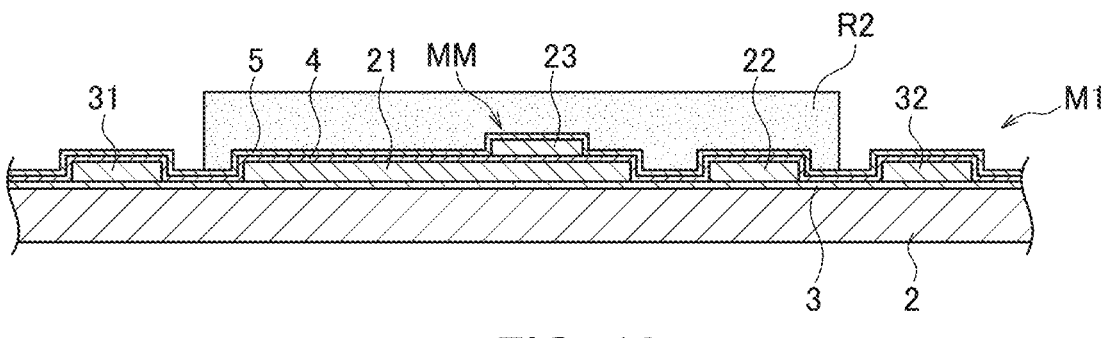
Figure 17:
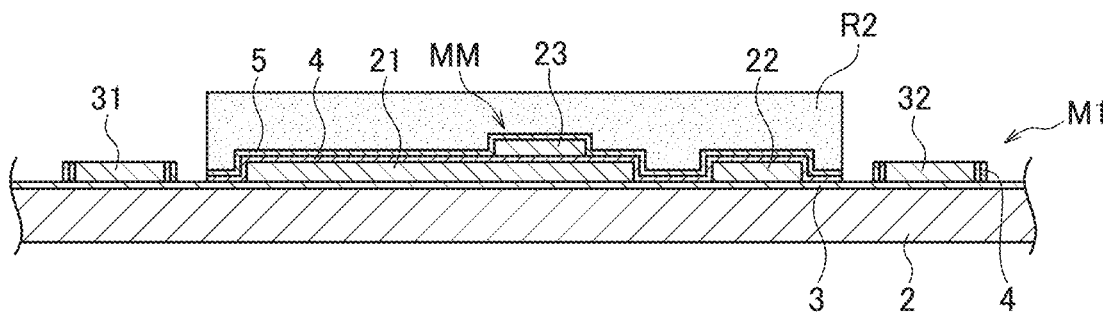

Then, as illustrated in FIG. 16, a resist layer R2 is formed so as to cover the conductor patterns 21 and 22 without covering the sacrificial patterns 31 and 32. The edges of the resist layer R2 are set slightly inside the edges of a portion that corresponds to the LC composite electronic component 1 to be finally obtained. In this state, the passivation film 5 and dielectric film 4 are etched to remove, as illustrated in FIG. 17, the passivation film 5 and dielectric film 4 at a portion corresponding to the outer peripheral portion of the LC composite electronic component 1. The passivation film 5 and dielectric film 4 are preferably subjected to highly anisotropic etching such as ion milling. As a result, the passivation film 5 and dielectric film 4 that cover portions parallel to the substrate 2, i.e., the surface of the planarizing layer 3 and upper surfaces of the sacrificial patterns 31 and 32 are removed, while the passivation film 5 and dielectric film 4 that cover portions perpendicular to the substrate 2, i.e., the side surfaces of the sacrificial patterns 31 and 32 are left without being removed.

Figure 18:
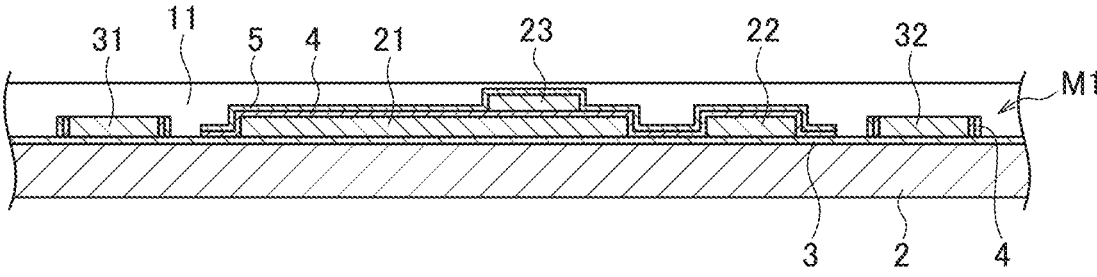
Figure 19:
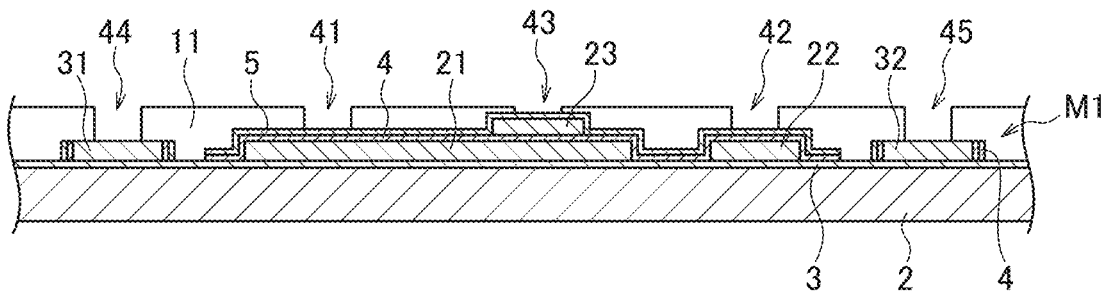

Then, as illustrated in FIG. 18, the insulating resin layer 11 is formed so as to cover the conductor layers M1 and MM. The insulating resin layer 11 can be formed by a coating method (e.g., spin-coating method). This is because, since the total film thickness of the conductor layers M1 and MM is as thin as about, e.g., 10 μm, the coating method costs less than a laminate method. The insulating resin layer 11 may be formed using photosensitive polyimide resin. Then, as illustrated in FIG. 19, the insulating resin layer 11 is patterned to form openings 41 to 45 in the insulating resin layer 11. The openings 41 to 45 can be formed by a photolithography method using a not-shown photomask. As a result, the passivation film 5 covering the upper surface of the conductor patterns 21 to 23 is exposed through the openings 41 to 43, and the sacrificial patterns 31 and 32 are exposed respectively through the openings 44 and 45.

Figure 20:
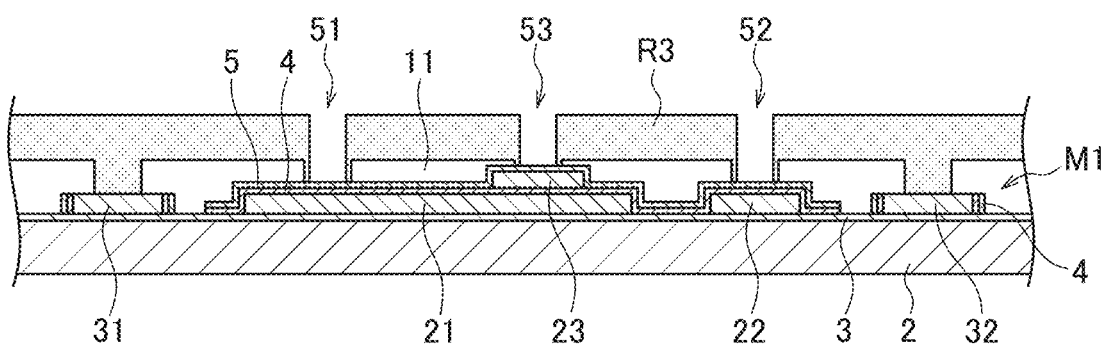

Then, as illustrated in FIG. 20, a resist layer R3 is formed on the insulating resin layer 11, followed by formation of openings 51 to 53 in the resist layer R3. The openings 51 to 53 are formed at positions overlapping the openings 41 to 43, respectively. As a result, the passivation film 5 covering the upper surfaces of the conductor patterns 21 to 23 are exposed through the openings 51 to 53. In this state, ion-milling or the like is performed to remove parts of the passivation film 5 and dielectric film 4 exposed to the openings 51 and 52 and to remove a part of the passivation film 5 exposed to the opening 53. As a result, the upper surfaces of the conductor patterns 21 to 23 are exposed at positions overlapping the openings 51 to 53.

Figure 21:
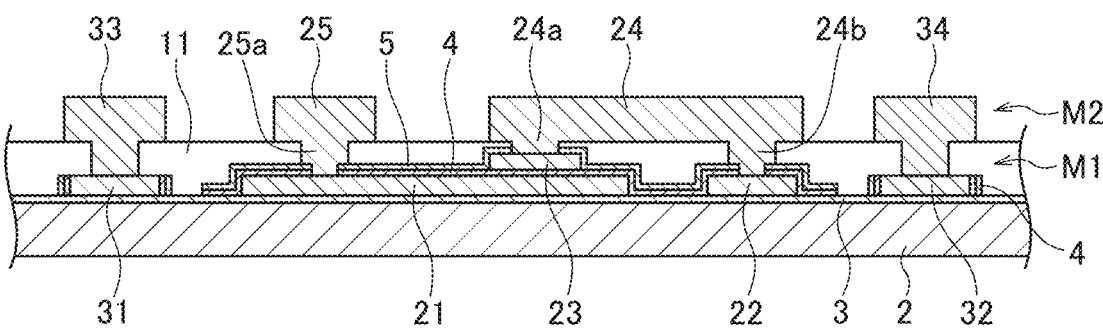

After removal of the resist layer R3, the conductor layer M2 is formed on the insulating resin layer 11 by the same formation method as that for the conductor layer M1, as illustrated in FIG. 21. In the cross section illustrated in FIG. 21, the conductor layer M2 includes the conductor patterns 24, 25 and sacrificial patterns 33, 34. The conductor pattern 24 is connected to the conductor patterns 22 and 23 through openings formed in the insulating resin layer 11, and the conductor pattern 25 is connected to the conductor pattern 21 through an opening formed in the insulating resin layer 11. Parts of the conductor patterns 24 and 25 positioned inside the openings formed in the insulating resin layer 11 constitute the via conductors 24a, 24b, and 25a. The sacrificial patterns 33 and 34 are connected respectively to the sacrificial patterns 31 and 32 through openings formed in the insulating resin layer 11.

Figure 22:
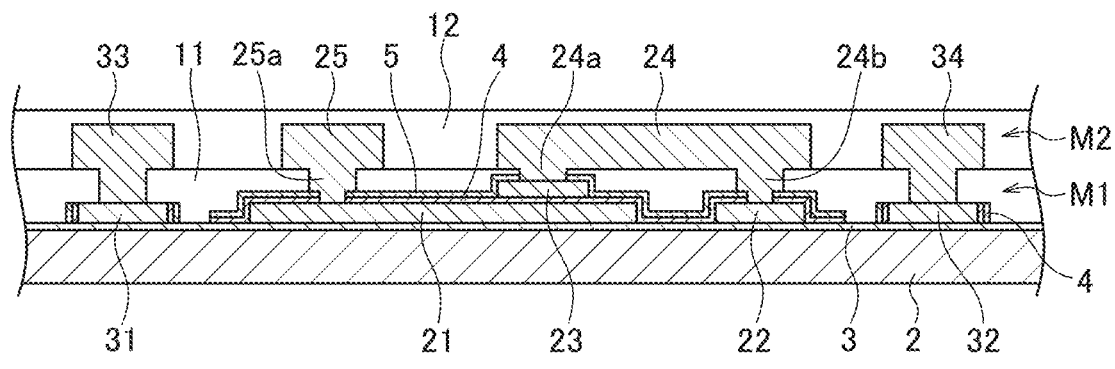

Then, as illustrated in FIG. 22, the insulating resin layer 12 is formed so as to cover the conductor layer M2. The insulating resin layer 12 can be formed by a laminate method. This is because, since the thickness of the conductor layer M2 is as thick as about, e.g., 20 μm, the laminate method costs lower than a coating method. The insulating resin layer 12 may be formed using non-photosensitive epoxy resin. The insulating resin layer 12 is added with a filler for adjusting a thermal expansion coefficient and thus has a thermal expansion coefficient lower than that of the insulating resin layer 11.

Figure 23:
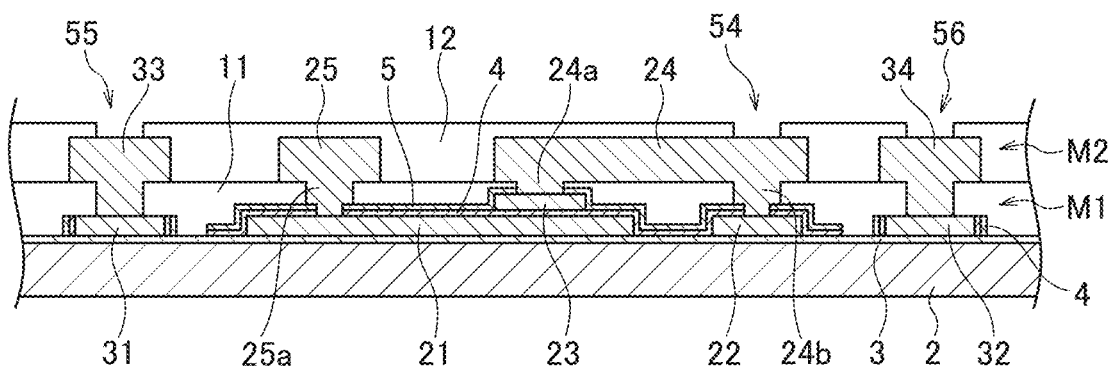

Then, as illustrated in FIG. 23, openings 54 to 56 are formed in the insulating resin layer 12. The openings 54 to 56 can be formed by laser processing. As a result, the conductor pattern 24 is exposed through the opening 54, and the sacrificial patterns 33 and 34 are exposed respectively through the openings 55 and 56. After that, desmear treatment is performed using permanganate or the like to remove a residue in the openings 54 to 56.

Figure 24:
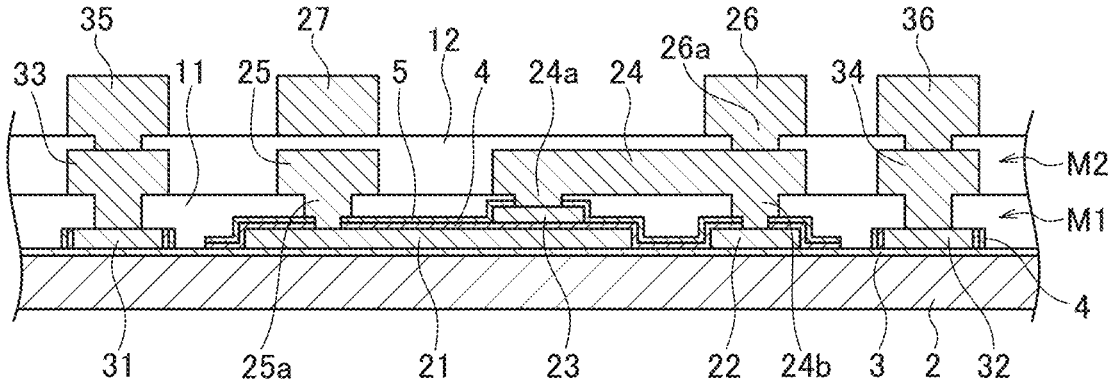

Then, as illustrated in FIG. 24, the conductor layer M3 is formed on the insulating resin layer 12 by the same formation method as that for the conductor layer M1. In the cross section illustrated in FIG. 24, the conductor layer M3 includes the conductor patterns 26, 27 and sacrificial patterns 35, 36. The conductor pattern 26 is connected to the conductor pattern 24 through an opening formed in the insulating resin layer 12. A part of the conductor pattern 26 positioned inside the openings formed in the insulating resin layer 12 constitute the via conductor 26a. The sacrificial patterns 35 and 36 are connected respectively to the sacrificial patterns 33 and 34 through openings formed in the insulating resin layer 12.

Figure 25:
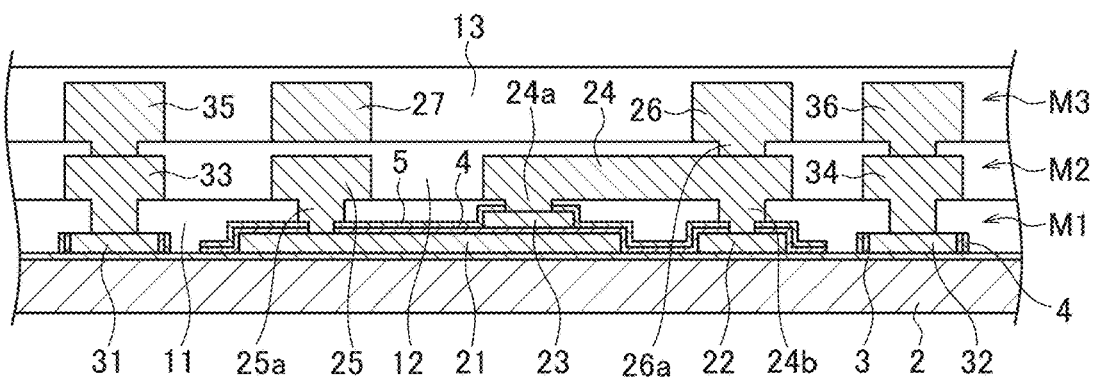

Then, as illustrated in FIG. 25, the insulating resin layer 13 is formed so as to cover the conductor layer M3. The insulating resin layer 13 can be formed by a laminate method. This is because, since the thickness of the conductor layer M3 is as thick as about, e.g., 35 μm, the laminate method costs lower than a coating method. The insulating resin layer 13 may be formed using the same material as that of the insulating resin layer 12.

Figure 26:
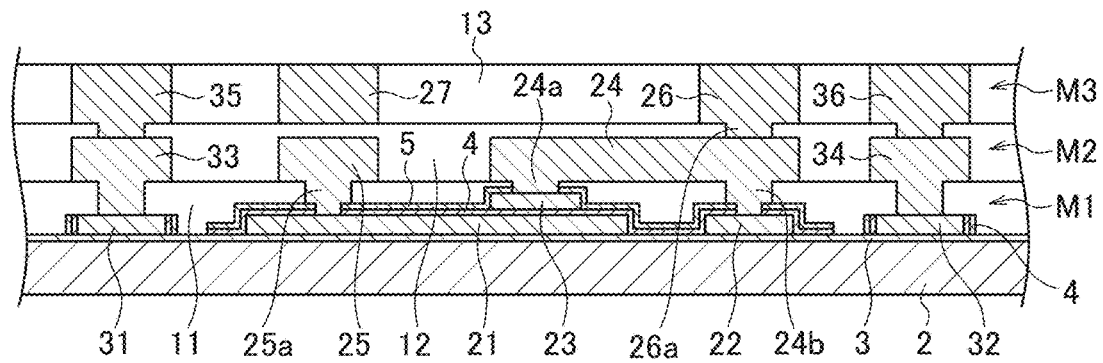
Figure 27:
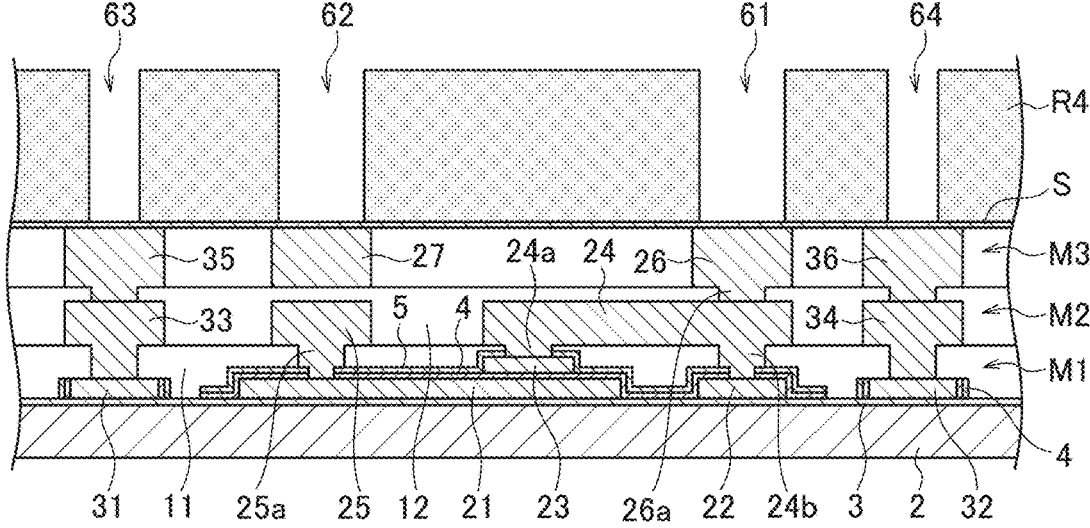
Figure 28:
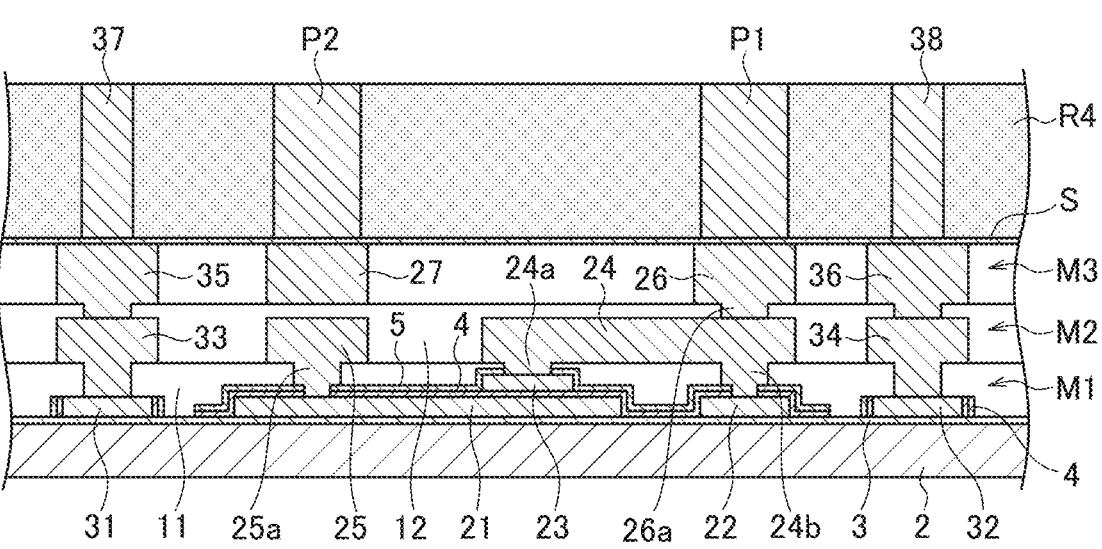

Then, as illustrated in FIG. 26, the surface of the insulating resin layer 13 is subjected to polishing, grinding, or ashing until the conductor layer M3 is exposed. After the surface of the conductor layer M3 is thus exposed, the seed layer S and a resist layer R4 are formed on the entire surface of the conductor layer M3 as illustrated in FIG. 27. After that, openings 61 to 64 are formed in the resist layer R4. The openings 61 to 64 are formed at positions overlapping respectively the conductor patterns 26, 27 and the sacrificial patterns 35, 36, respectively. Then, as illustrated in FIG. 28, electrolyte plating is performed using the seed layer S as a feed to form the post conductors P1, P2 and sacrificial patterns 37, 38 in the openings 61 to 64, respectively.

Figure 29:
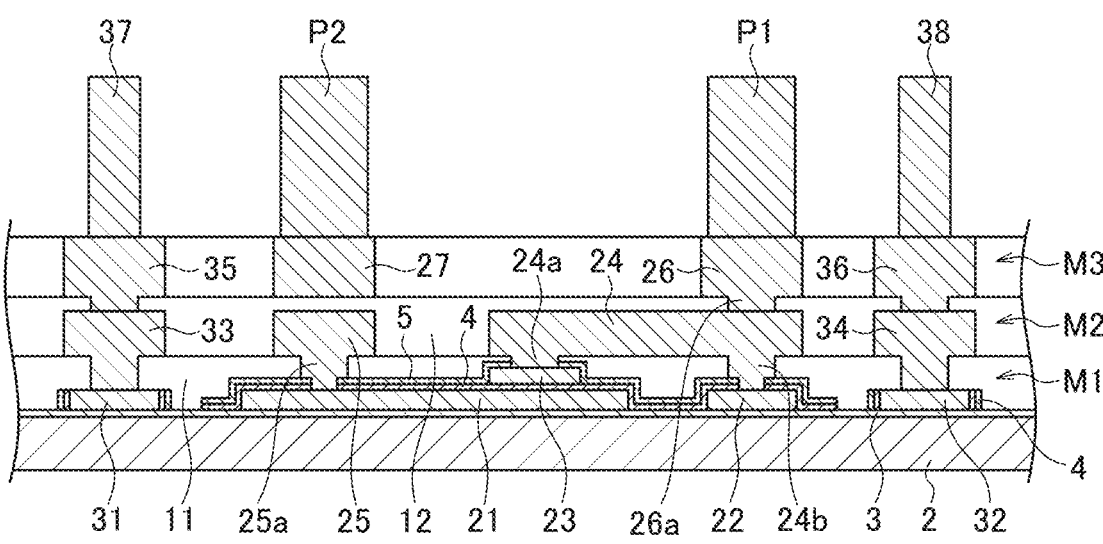
Figure 30:
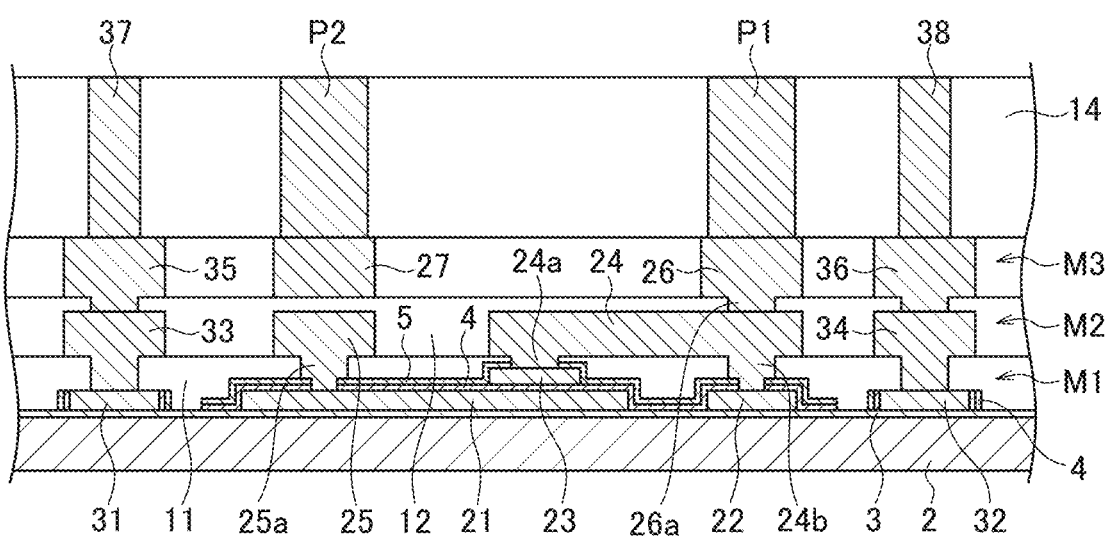

Then, as illustrated in FIG. 29, the resist layer R4 is removed, followed by removal of the exposed seed layer S. Subsequently, as illustrated in FIG. 30, the insulating resin layer 14 is formed so as to cover the post conductors P1, P2 and sacrificial patterns 37, 38, and then the surface of the insulating resin layer 14 is subjected to polishing, grinding, or ashing until the post conductors P1, P2 and sacrificial patterns 37, 38 are exposed. The insulating resin layer 14 can be formed by a laminate method. This is because, since the height H of the post conductors P1 and P2 is as large as about, e.g., 60 μm, the laminate method costs lower than a coating method. The insulating resin layer 14 may be formed using the same material as those of the insulating resin layers 12 and 13.

Figure 31:
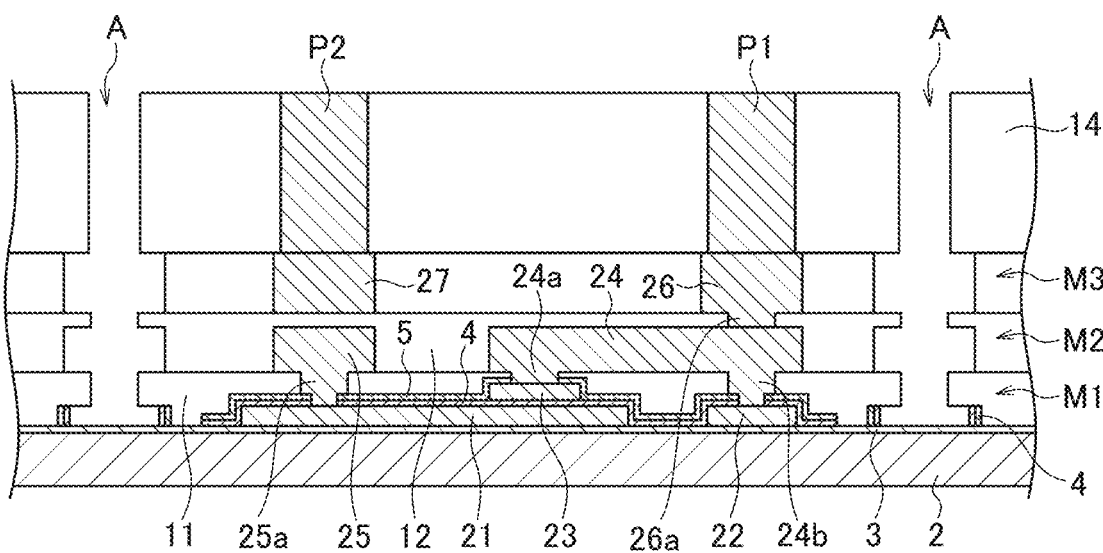

Then, as illustrated in FIG. 31, etching is performed using acid to remove the sacrificial patterns 31 to 38. As a result, a space A is formed in the area where the sacrificial patterns 31 to 38 are removed. Subsequently, the terminal electrodes E1 and E2 are formed on the surface of the insulating resin layer 14 so as to contact the upper ends of the respective post conductors P1 and P2, followed by cutting of the substrate 2 along the space A for singulation of the LC composite electronic component 1. The LC composite electronic component 1 according to the present embodiment is thus completed.

Figure 32:
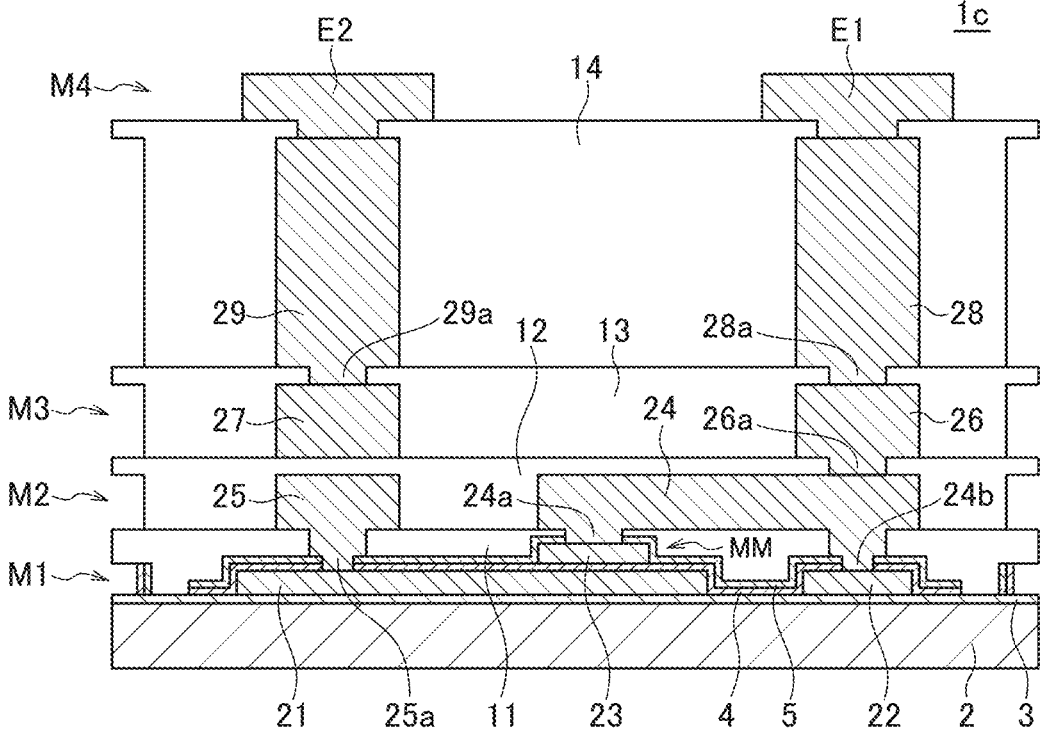
FIG. 32 is a schematic cross-sectional view for explaining the structure of an LC composite electronic component 1c according to a second embodiment of the present disclosure.

FIG. 32 is a schematic cross-sectional view for explaining the structure of an LC composite electronic component 1c according to a second embodiment of the present disclosure.

As illustrated in FIG. 32, the LC composite electronic component 1c according to the second embodiment differs from the LC composite electronic component 1 according to the first embodiment illustrated in FIG. 1 in that the post conductors P1, P2 and conductor patterns 26, 27 are connected respectively to each other through via conductors and that the terminal electrodes E1, E2 are connected respectively to the post conductors P1, P2 through via conductors. Other basic configurations are the same as those of the LC composite electronic component 1 according to the first embodiment, so the same reference numerals are given to the same elements, and overlapping description will be omitted.

The above structure can be obtained by forming openings in the insulating resin layers 13 and 14 instead of grinding of the insulating resin layers 13 and 14 described using FIGS. 26 and 30.

While the preferred embodiment of the present disclosure has been described, the present disclosure is not limited to the above embodiment, and various modifications may be made within the scope of the present disclosure, and all such modifications are included in the present disclosure.

For example, the terminal electrodes E1 and E2 may be formed by printing a conductive paste for a resin electrode onto the surfaces of the post conductors P1 and P2 and then by covering the surface of the conductive paste with an Ni/Si film.

The technology according to the present disclosure includes the following configuration examples but not limited thereto.

An LC composite electronic component according to the present disclosure includes: a substrate; a capacitor element provided on the substrate; a first insulating resin layer embedding therein the capacitor element; an inductor element provided on the first insulating resin layer and connected to the capacitor element; a second insulating resin layer embedding therein the inductor element; a third insulating resin layer provided on the second insulating resin layer; a post conductor having a lower end and an upper end and penetrating the third insulating resin layer such that the lower end of the post conductor is connected to the inductor element; and a terminal electrode provided on the third insulating resin layer and connected to the upper end of the post conductor. The height of the post conductor is larger than the thickness of a conductor pattern constituting the inductor element.

According to the present disclosure, the post conductor has a sufficient height, so that, in a state where the LC composite electronic component is mounted on a circuit board, it is possible to ensure a sufficient distance between a conductor pattern on the circuit board and the inductor element incorporated in the LC composite electronic component. This can enhance the Q value of the inductance element in the mounting state on the circuit board. In addition, stress to be applied from the terminal electrode side to the capacitor element is relaxed by the elongated post conductor, thus making cracks unlikely to occur in the capacitor element.

In the present disclosure, the height of the post conductor may be a value of three times or less the thickness of the conductor pattern constituting the inductor element. This is because, if the height of the post conductor is set larger than the above value, the Q value hardly changes.

In the present disclosure, the height of the post conductor may be larger than the thickness of the substrate. This can reduce the entire component thickness.

In the present disclosure, the height of the post conductor may be smaller than the thickness from a surface of the substrate to a conductor layer as the uppermost one of the conductor layers constituting the inductor element. This can ensure a sufficient thickness of the conductor pattern constituting the inductor element.

As described above, according to the present disclosure, there can be provided an LC composite electronic component capable of maintaining the Q value of the inductor element at a satisfactory level in a state where it is mounted on the circuit board.

What is claimed is:

1. An electronic component comprising:
a substrate;
a capacitor on the substrate;
a first insulating resin layer embedding therein the capacitor;
an inductor including a first conductor pattern on the first insulating resin layer and a via conductor connected to the capacitor so as to penetrate the first insulating resin layer;
a second insulating resin layer embedding therein the inductor;
a third insulating resin layer on the second insulating resin layer;
a post conductor having a lower end and an upper end and penetrating the third insulating resin layer such that the lower end of the post conductor is connected to the first conductor pattern of the inductor; and
a terminal electrode on the third insulating resin layer and connected to the upper end of the post conductor,
wherein, in a thickness direction of the substrate, a height of the post conductor is larger than a thickness of the first conductor pattern of the inductor, and
wherein, in the thickness direction of the substrate, the thickness of the first conductor pattern is larger than a thickness of the via conductor.

2. The electronic component as claimed in claim 1, wherein the height of the post conductor is a value of three times or less the thickness of the first conductor pattern of the inductor.

3. The electronic component as claimed in claim 1, wherein the height of the post conductor is larger than a thickness of the substrate.

4. The electronic component as claimed in claim 1, wherein the height of the post conductor is smaller than a thickness from a top surface of the substrate to a bottom surface of a conductor layer as an uppermost one of conductor layers constituting the inductor.

5. The electronic component as claimed in claim 1, wherein the height of the post conductor is not smaller than a thickness of the third insulating resin layer.

6. The electronic component as claimed in claim 1, wherein the height of the post conductor is larger than a thickness of the terminal electrode.

7. The electronic component as claimed in claim 1, wherein the height of the post conductor is larger than a sum of thickness of the first insulating resin layer and the second insulating resin layer.

8. The electronic component as claimed in claim 1, further comprising:
a fourth insulating resin layer located between the second insulating resin layer and the third insulating resin layer; and
a second conductor pattern embedded in the fourth insulating resin layer,
wherein the lower end of the post conductor is connected to the first conductor pattern of the conductor via the second conductor pattern, and
wherein the height of the post conductor is smaller than a sum of thicknesses of the first insulating resin layer, the second insulating resin layer, and the third insulating resin layer.

9. The electronic component as claimed in claim 2, wherein the height of the post conductor is smaller than a thickness from a top surface of the substrate to a bottom surface of a conductor layer as an uppermost one of conductor layers constituting the inductor.

10. The electronic component as claimed in claim 2, wherein the height of the post conductor is not smaller than a thickness of the third insulating resin layer.

11. The electronic component as claimed in claim 3, wherein the height of the post conductor is smaller than a thickness from a top surface of the substrate to a bottom surface of a conductor layer as an uppermost one of conductor layers constituting the inductor.

12. The electronic component as claimed in claim 4, wherein the height of the post conductor is not smaller than a thickness of the third insulating resin layer.

13. An electronic component comprising:
a substrate;
a first insulation layer on the substrate, the first insulation layer including at least a first layer and a second layer on the first layer;
a second insulation layer on the first insulation layer;
a capacitor on the substrate and embedded in the first layer of the first insulation layer;
an inductor having one or more conductor layers of conductor patterns embedded in at least the second layer of the first insulation layer, a part of the one or more conductor layers of conductor patterns electrically connected to the capacitor;
a post conductor having a lower end and an upper end and penetrating the second insulation layer, the lower end of the post conductor being electrically connected to the inductor, a length between the lower end and the upper end of the post conductor being larger than a thickness of a sum of the first layer and the second layer of the first insulation layer; and a terminal electrode on the second insulating layer and electrically connected to the upper end of the post conductor.

14. The electronic component as claimed in claim 13, wherein the length between the lower end and the upper end of the post conductor is less than three times the thickness of one conductor layer of the one or more conductor layers of conductor patterns.

15. The electronic component as claimed in claim 13, wherein the length between the lower end and the upper end of the post conductor is larger than a thickness of the substrate.

16. The electronic component as claimed in claim 13, wherein the length between the lower end and the upper end of the post conductor is smaller than a thickness from a top surface of the substrate facing the first insulation layer to a bottom surface of an upper most conductor layer of the one or more conductor layers of conductor patterns, the upper most conductor layer being closest to the second insulation layer among the one or more conductor layers of conductor patterns.

17. The electronic component as claimed in claim 13, wherein the length between the lower end and the upper end of the post conductor is not smaller than a thickness of the second insulation layer.

18. The electronic component as claimed in claim 13, wherein the length between the lower end and the upper end of the post conductor is larger than a thickness of the terminal electrode.

19. The electronic component as claimed in claim 13, further comprising an additional conductor pattern, wherein the first insulation layer further includes a third layer on the second layer, wherein the additional conductor pattern is embedded in the third layer of the first insulation layer, wherein the lower end of the post conductor is connected to the inductor via the additional conductor pattern, and wherein the length between the lower end and the upper end of the post conductor is smaller than a sum of thickness of the first layer, the second layer, and the third layer.

* * * * *